United States Patent
Murthy et al.

(10) Patent No.: US 6,621,131 B2
(45) Date of Patent: Sep. 16, 2003

(54) SEMICONDUCTOR TRANSISTOR HAVING A STRESSED CHANNEL

(75) Inventors: Anand Murthy, Portland, OR (US);
Robert S. Chau, Beaverton, OR (US);
Tahir Ghani, Portland, OR (US);
Kaizad R. Mistry, Lake Oswego, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/002,465

(22) Filed: Nov. 1, 2001

(65) Prior Publication Data

US 2003/0080361 A1 May 1, 2003

(51) Int. Cl.[7] ............................................. H01L 29/76
(52) U.S. Cl. ..................... 257/408; 257/336; 257/344; 257/61; 257/55; 257/57; 257/192; 438/514; 438/521
(58) Field of Search ................. 257/408, 336, 257/344, 61, 55, 57, 192; 438/514, 521

(56) References Cited

U.S. PATENT DOCUMENTS 5,698,869 A  * 12/1997 Yoshimi et al. ............. 257/192
5,763,319 A  *  6/1998 Ling et al. ................... 438/514
5,841,173 A  * 11/1998 Yamashita .................... 257/384
5,990,516 A  * 11/1999 Momose et al. ............. 257/327

OTHER PUBLICATIONS

Kwok K. Ng. "complete guide to semiconductor device", McGraw–Hill, p. 614.*

* cited by examiner

Primary Examiner—Sara Crane
Assistant Examiner—Junghwa Im
(74) Attorney, Agent, or Firm—Blakely, Sokoloff, Taylor & Zafman LLP

(57) ABSTRACT

A process is described for manufacturing an improved PMOS semiconductor transistor. Recesses are etched into a layer of epitaxial silicon. Source and drain films are deposited in the recesses. The source and drain films are made of an alloy of silicon and germanium. The alloy is epitaxially deposited on the layer of silicon. The alloy thus has a lattice having the same structure as the structure of the lattice of the layer of silicon. However, due to the inclusion of the germanium, the lattice of the alloy has a larger spacing than the spacing of the lattice of the layer of silicon. The larger spacing creates a stress in a channel of the transistor between the source and drain films. The stress increases $I_{DSAT}$ and $I_{DLIN}$ of the transistor. An NMOS transistor can be manufactured in a similar manner by including carbon instead of germanium, thereby creating a tensile stress.

20 Claims, 3 Drawing Sheets

SEMICONDUCTOR TRANSISTOR HAVING A STRESSED CHANNEL

BACKGROUND OF THE INVENTION

1). Field of the Invention

This invention relates to the field of semiconductor manufacturing, and more specifically to a semiconductor transistor and its manufacture.

2). Discussion of Related Art

Integrated circuits are often manufactured in and on silicon and other semiconductor wafers. Such integrated circuits include literally millions of metal oxide semiconductor (MOS) field effect transistors, having gate lengths on the order of 0.05 microns. Such MOS transistors may include p-channel MOS (PMOS) transistors, and n-channel MOS (NMOS) transistors, depending on their dopant conductivity types.

Wafers are obtained by drawing an ingot of silicon out of a liquid silicon bath. The ingot is made of monocrystalline (single-crystal) silicon, and is subsequently sawed into individual wafers. A layer of silicon is then deposited over each wafer. Because the wafer is made of monocrystalline silicon, the deposition conditions can be controlled so that the layer of silicon deposits "epitaxially" over the wafer. "Epitaxy" refers to the manner in which the silicon layer deposits on the wafer—the layer of silicon has a lattice which has a structure which follows a structure of a lattice of the monocrystalline silicon of the wafer. The layer of silicon is also substantially the same material as the monocrystalline silicon of the wafer, so that the lattice of the silicon layer also has substantially the same spacing as the spacing of the lattice of the monocrystalline silicon of the wafer.

A gate dielectric layer, a gate electrode, and spacers are subsequently formed on the layer of silicon. Ions are also implanted into the layer of silicon, which form source and drain regions on opposing sides of the gate electrode. A voltage can be applied over the source and drain regions. Current flows from the source region to the drain region through a channel below the gate dielectric layer when a voltage is applied to the gate electrode.

BRIEF DESCRIPTION OF THE DRAWINGS

The invention is described by way of example, with reference to the accompanying drawings, wherein.

DETAILED DESCRIPTION OF THE INVENTION

A process is described for manufacturing an improved PMOS semiconductor transistor. Recesses are etched into a layer of epitaxial silicon. Source and drain films are deposited in the recesses. The source and drain films are made of an alloy of silicon, germanium, and boron incorporated during deposition. By incorporating boron during deposition, a higher active dopant concentration can be obtained than with implantation techniques. The alloy is epitaxially deposited on the layer of silicon. The alloy thus has a lattice having the same structure as the structure of the lattice of the layer of silicon. However, due to the inclusion of the germanium, the lattice of the alloy has a larger spacing than the spacing of the lattice of the layer of silicon. The larger spacing creates a stress in a channel of the transistor between the source and drain films. The stress, together with reduced resistivity due to the higher active dopant concentration, increases $I_{DSAT}$ and $I_{DLIN}$ of the transistor. An NMOS transistor can be manufactured in a similar manner by including carbon instead of germanium, thereby creating a tensile stress. The present invention will be described with respect to the formation of a PMOS transistor. One skilled in the art will appreciate that an NMOS transistor may be manufactured in a similar manner, except that doping conductivity types and lattice spacing will be reversed.

Figure 1:
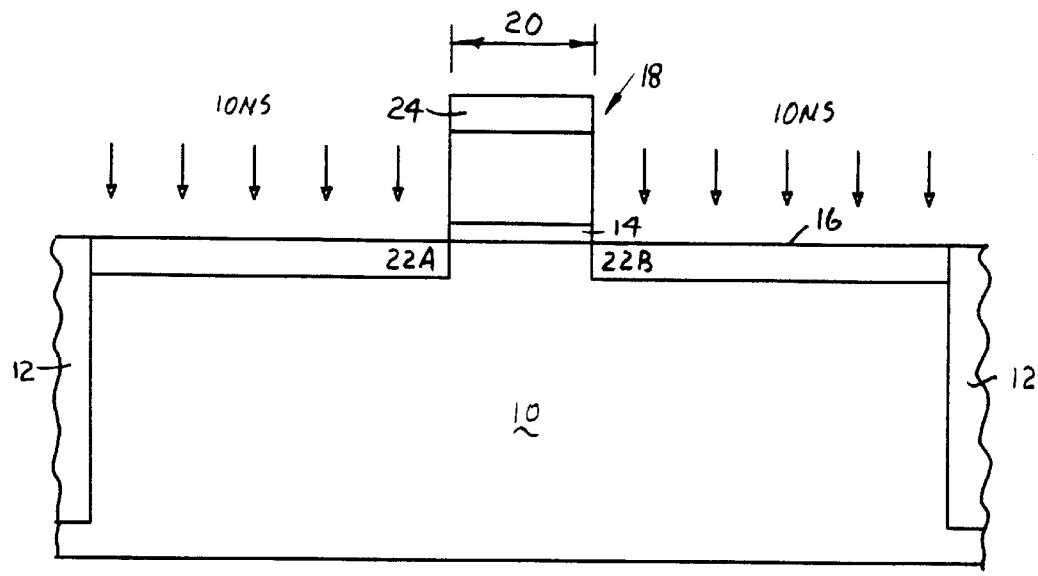
FIG. 1 is a cross-sectional side view of a partially manufactured PMOS transistor, including a gate electrode and lightly doped regions on opposing sides of the gate electrode.

FIG. 1 of the accompanying drawings illustrates an epitaxial silicon layer 10 which is epitaxially formed on a monocrystalline wafer substrate. Because the silicon layer 10 is epitaxially formed, it follows the monocrystalline crystal structure of the wafer substrate. The silicon of the layer 10 is thus also monocrystalline. The silicon layer 10 includes an n-type dopant, which can be formed by implanting phosphorous and arsenic ions to produce an n-well, having an n-type dopant concentration of approximately 5.0 times $10^{18}/cm^3$. (An N+ film is thus created.)

A plurality of field isolation regions 12 are formed in the layer 10. The field isolation regions 12 isolate wells of different conductivity types, and isolate adjacent transistors. The field isolation regions 12 may, for example, be shallow trench isolation (STI) regions formed by etching a trench into the layer 10, and then filling the trench with deposited oxide.

A gate dielectric layer 14 is formed on a top surface 16 of the layer 10. The gate dielectric layer 14 may be a nitrided oxide layer formed to a thickness of between 5 and 30 Å, preferably approximately 8 Å.

A gate electrode 18 is formed on the gate dielectric layer 14. The gate electrode 18 is preferably between 1,000 and 3,500 Å thick. The gate electrode 18 may be formed by blanket deposition of polysilicon, and patterning the polysilicon into the gate electrode 18 utilizing known photolithographic techniques. In the exemplary embodiment, the gate electrode 18 has a width 20 of approximately 89 nm.

P-dopant ions are subsequently implanted from the top into an exposed upper surface of the layer 10, and into an exposed upper surface of the gate electrode 18. The dopant ions may, for example, be boron ions. The ions form conductive p-doped regions 22A and 22B. The regions 22A and 22B are located on opposing sides of the gate electrode 18, and are spaced from one another by the width 20. A conductive p-doped region 24 is also formed in an upper portion of the gate electrode 18.

Figure 2:
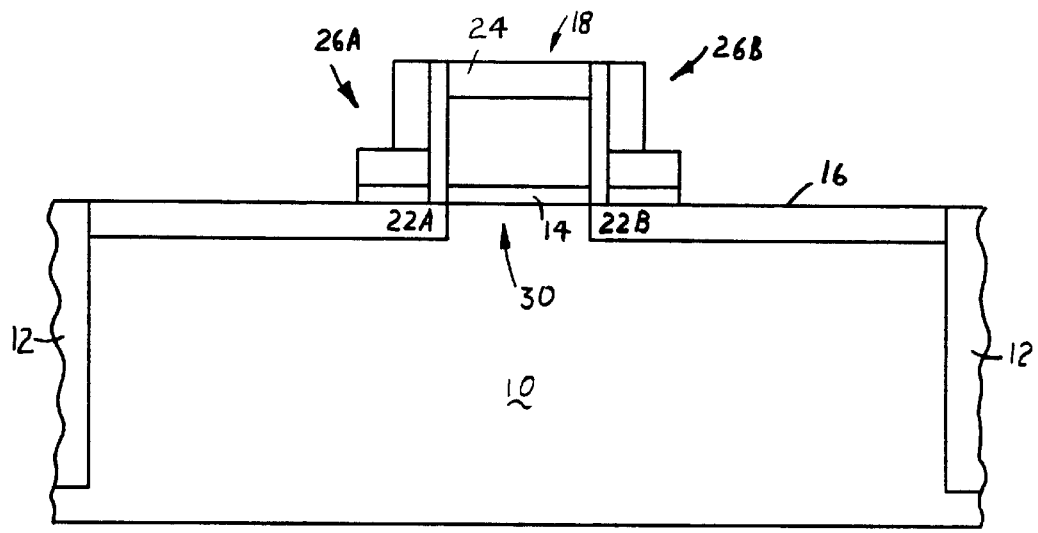
FIG. 2 is a view similar to FIG. 1, after the formation of spacers on opposing sides of the gate electrode.

FIG. 2 illustrates that spacers 26A and 26B are formed on opposing sides of the gate electrode 18. The spacers 26A and 26B cover sides of the gate electrode 18, and also cover portions of the surface 16 adjacent and on opposing sides of the gate electrode 18. In the present example, the spacers 26A and 26B are L-shaped spacers, the formation of which is known in the art.

Figure 3:
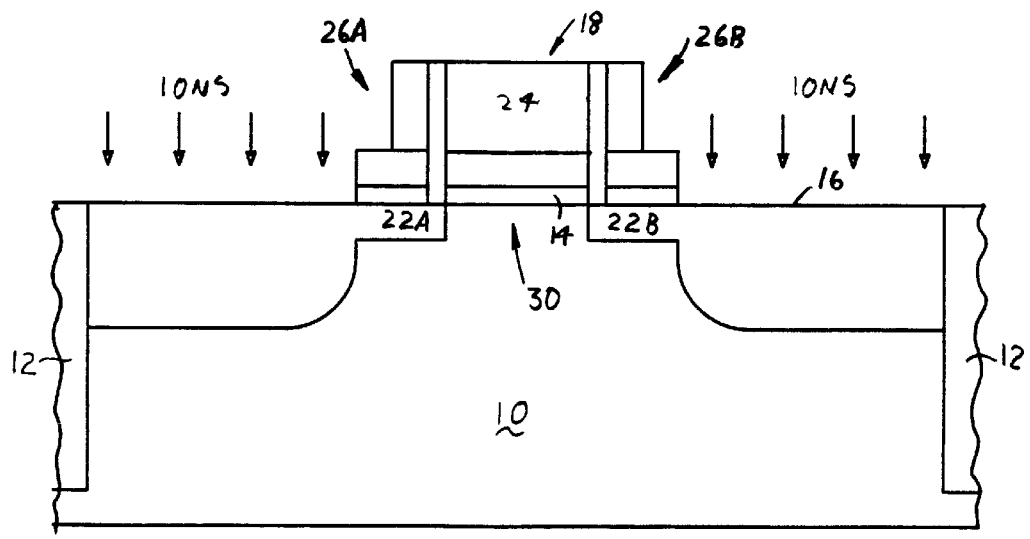
FIG. 3 is a view similar to FIG. 2, after the formation of deeper source and drain regions.

As shown in FIG. 3, upper surfaces of the gate electrode 18 and the surface 16 are then again implanted with p-dopant ions, typically boron ions as in the implantation step of FIG. 1. The implantation energy is increased, compared to the implantation step of FIG. 1, so that the boron ions implant deeper into the layer 10. The spacers 26A and 26B form a mask which prevents implantation of the ions into the layer 10 below the spacers 26A and 26B. P-doped conductive regions 28A and 28B are formed by the ions in the layer 10 to a depth deeper than the regions 22A and 22B. However, a shallow channel 30 is defined between inner edges of the doped regions 22A and 22B resulting from the implantation step of FIG. 1. The doped region 24 in the gate electrode 18 is also deeper after the second implantation step.

Figure 4:
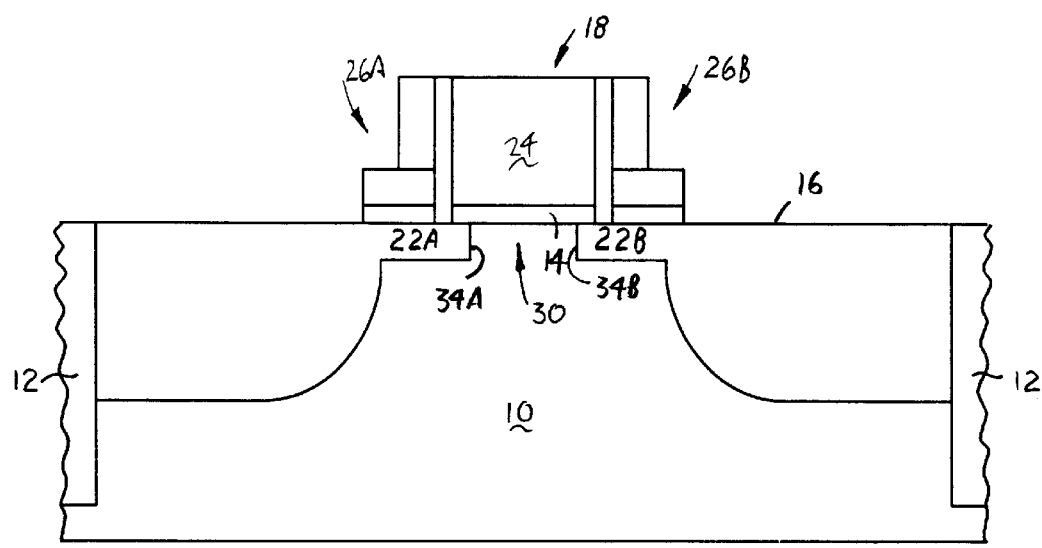
FIG. 4 is a view similar to FIG. 3, after diffusion of the doped regions in a thermal step.

A heat treatment or "annealing" step is subsequently carried out, wherein the structure of FIG. 3 is heated. Heating causes diffusion of the regions 22A, 22B, 28A, and 28B into the layer 10. As shown in FIG. 4, inner tips 34A and 34B are then located below the gate electrode 18. Lower edges of the regions 28A and 28B move downward into the layer 10. The regions 22A and 22B are epitaxial silicon with a p-dopant concentration of approximately $1 \times 10^{19}/cm^3$. (The regions 22A and 22B are thus doped P−.) No other materials are present in the regions 22A and 22B, except silicon, arsenic, phosphorous, and boron. The doped region 24 in the gate electrode 18 also diffuses down to the gate dielectric layer 14.

Figure 5:
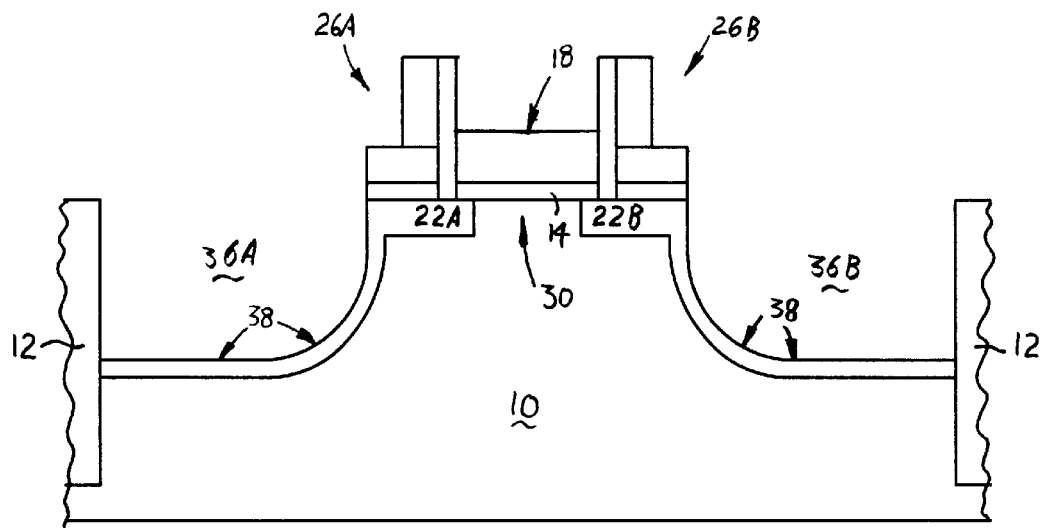
FIG. 5 is a view similar to FIG. 4, after a selective etch to form recesses in the source and drain regions.

FIG. 5 shows the structure of FIG. 4 after a selective etch step. An anisotropic etchant is used which selectively removes silicon over the other exposed materials of the structure of FIG. 4. Recesses 36A and 36B are thereby etched into the regions 28A and 28B. Inner edges of the recesses 36A and 36B are aligned with outer edges of the spacers 26A and 26B. Outer edges of the recesses 36A and 36B are at the field isolation regions 12. It should be noted that surfaces 38 of the recesses 36A and 36B are monocrystalline epitaxial silicon. Epitaxial silicon has a lattice with a known structure and spacing. An upper portion of the gate electrode 18 is also etched out.

Figure 6:
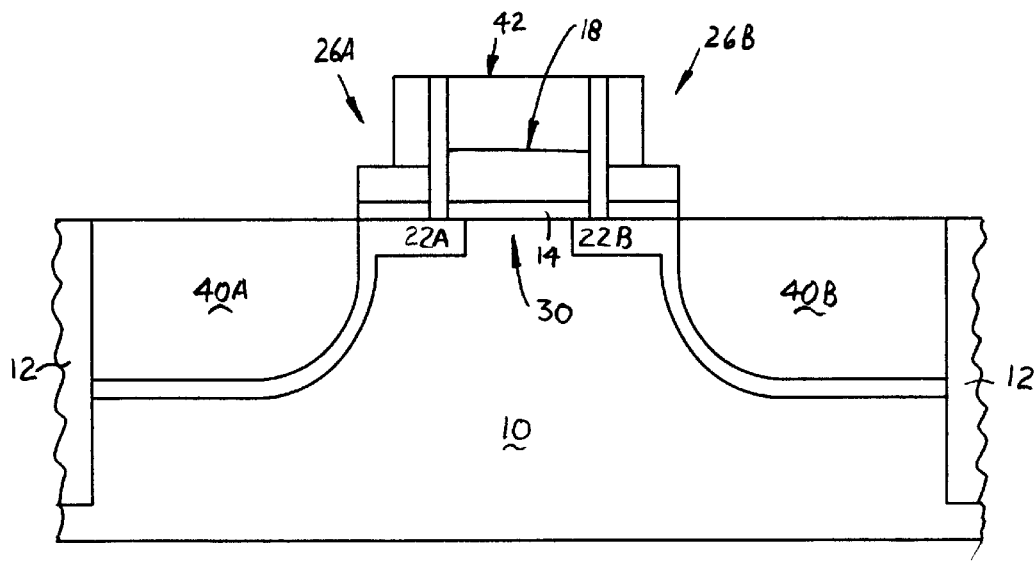
FIG. 6 is a view similar to FIG. 5, after depositing source and drain films epitaxially in the recesses.

As shown in FIG. 6, source and drain films 40A and 40B are subsequently formed in the recesses 36A and 36B. The films 40A and 40B are epitaxially formed on the surfaces 38. The films 40A and 40B include silicon, germanium, and boron. The films can be formed in a 200 mm chemical vapor deposition chamber with the following processing conditions: dichlorosilane of 20 sccm, diborane of 70 sccm at 1% concentration, and germane of 50 sccm, at a temperature of 740° C.

The silicon and the germanium form an alloy having a lattice which has the same structure as the structure of the lattice of the epitaxial silicon of the surfaces 38. The lattice of the alloy of silicon and germanium, however, has a larger spacing than the spacing of the lattice of the epitaxial silicon of the surfaces 38, at least in a relaxed state. Because the lattice of the alloy has the same structure as the surfaces 38, the films 40A and 40B form epitaxially on the surfaces 38. However, because of the larger spacing of the lattice of the alloy, the films 40A and 40B create a compressive stress in the channel 30. The germanium is present in the combination of the silicon and the germanium in about 15 atomic percent. It has been found that epitaxy can be maintained with a germanium concentration of up to 20 atomic percent of the combination of the silicon and germanium by volume. Epitaxy thus tends to break down at an atomic percentage of germanium of above 20 percent. A further advantage of depositing the films 40A and 40B is that a relatively large boron concentration can be included. The boron concentration is preferably approximately $3 \times 10^{20}/cm^3$. (The films 40A and 40B are thus doped P+.) The relatively large concentration of boron creates a relatively low resistance of approximately 0.9 mOhm-cm. A conductive p-doped film 42 also deposits on the etched-back gate electrode 18. Suitable results can be obtained with dopant concentrations of $0.5 \times 10^{20}/cm^3$ and above. The resistivity is preferably less than 1.1 mOhm-cm.

Figure 7:
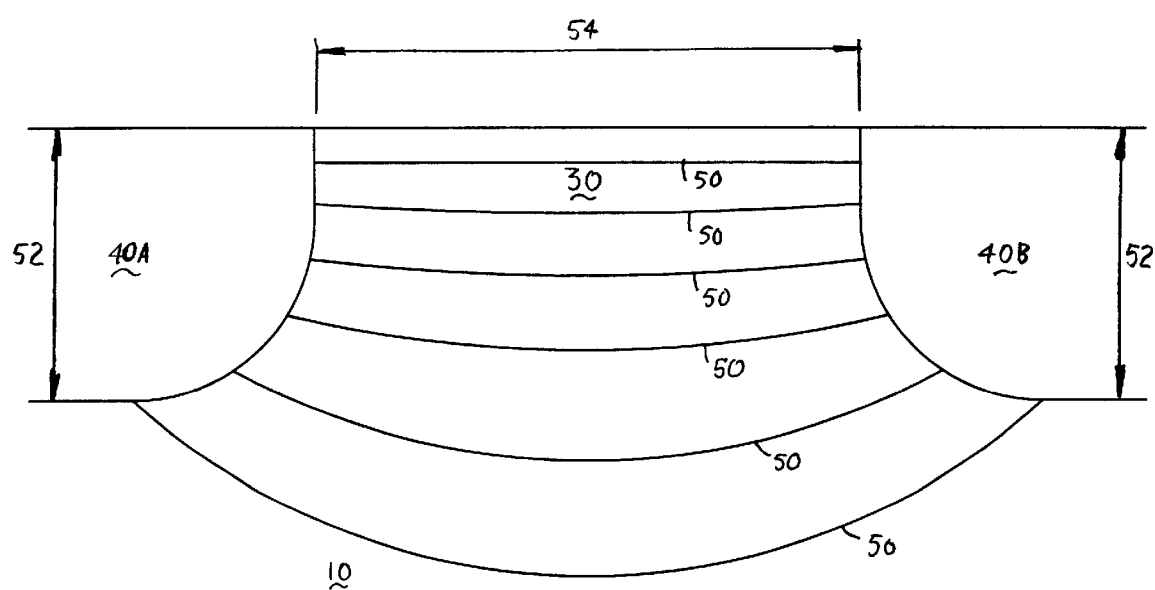
FIG. 7 is an enlarged view of a portion of FIG. 6, illustrating stresses that are created by the films.

FIG. 7 illustrates the direction of compressive stresses created by the films 40A and 40B. The directions of the compressive stresses are along the lines 50. A more dense spacing between the lines 50 indicates a larger stress, and a larger spacing between the lines 50 indicates a smaller stress. It can be seen that the largest stress is created at or near the channel 30. The films 40A and 40B extend to a depth 52 into the layer 10, and are spaced from one another by a width 54. A smaller ratio between the depth 52 and the width 54 will result in a smaller stress in the channel 30, and a larger ratio between the depth 52 and the width 54 will result in a larger stress in the channel 30. A ratio between the depth 52 and the width 54 is preferably at least 0.12, more preferably 0.15, more preferably 0.2, and more preferably 0.35. In the present example, the depth 52 is 92 nm, and the width 54 is 215 nm.

The compressive stress reduces the effective mass in the channel, which in turn increases hole mobility. It has been found that a compressive stress in the channel 30 increases the $I_{DSAT}$ of the PMOS transistor 60 by approximately 20 percent. The $I_{DLIN}$ is increased by approximately 40 percent.

In the present example, the layer 10 is epitaxial silicon, and the films 40A and 40B are silicon with a germanium additive. It may be possible to create similar structures utilizing additives other than germanium. The present example has also been described with reference to a PMOS transistor. An NMOS transistor may be manufactured in a similar manner. In an NMOS transistor, doping conductivity types would be reversed. Furthermore, a tensile stress will be created in the channel. A tensile stress can be created utilizing source and drain films of silicon which includes carbon. The silicon and carbon form an alloy which has a lattice with the same structure as the structure of the lattice of the epitaxial silicon, but with a smaller spacing. The source and drain films will tend to contract, and create a tensile stress in the channel.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

What is claimed:
1. A semiconductor transistor comprising:
a layer having source and drain recesses formed therein with a channel between the source and drain recesses, and being made of a semiconductor material having a first lattice with a first structure and a first spacing;
a source and a drain formed in the source and drain recesses respectively, at least one of the source and the drain being made of a film material which:
(a) includes a dopant selected from one of a p-dopant and an n-dopant; and
(b) is formed epitaxially on the semiconductor material so as to have a second lattice having a second structure which is the same as the first structure, the second lattice having a second spacing which differs from the first spacing; and

(i) if the dopant is a p-dopant, the second lattice has a second spacing which is larger than the first spacing, so that a compressive stress is created between the source and the drain in the channels; and (ii) if the dopant is an n-dopant, the second lattice has a second spacing which is smaller than the first spacing, so that a tensile stress is created between the source and the drain in the channel;

a gate dielectric layer on the channel; and a conductive gate electrode on the gate dielectric layer.

2. The semiconductor transistor of claim 1 wherein the difference between the first spacing and the second spacing creates a stress in the channel.

3. The semiconductor transistor of claim 1 wherein the second material includes the semiconductor material and an additive, the difference between the first spacing and the second spacing being due to the additive.

4. The semiconductor transistor of claim 3 wherein the semiconductor material is silicon and the additive is selected from one of germanium and carbon.

5. The semiconductor transistor of claim 4 wherein the additive is germanium.

6. The semiconductor transistor of claim 5 wherein the germanium comprises between 1 and 20 atomic percent in a combination of the silicon and the germanium of the film material.

7. The semiconductor transistor of claim 6 wherein the germanium comprises approximately 15 atomic percent in a combination of the silicon and the germanium of the film material.

8. The semiconductor transistor of claim 3, further comprising:

tip regions formed between the source and the drain with the channel between the tip regions, the tip regions being formed by implanting of dopants and excluding the additive.

9. The semiconductor transistor of claim 8 wherein:

(a) if the dopant of the film material is a p-dopant, the dopants of the tip regions are p-dopants; and (b) if the dopant of the film material is an n-dopant, the dopants of the tip regions are n-dopants.

10. The semiconductor transistor of claim 1 wherein the dopant comprises at least $0.5 \times 10^{20}/cm^3$ in the film material.

11. The semiconductor transistor of claim 10 wherein the film material has a resistivity of less than 1.1 mOhm-cm.

12. The semiconductor transistor of claim 1 wherein the source and drain have a depth into the layer and are spaced by a width from one another, a ratio of the depth to the width being at least 0.12.

13. The semiconductor transistor of claim 12 wherein the ratio is at least 0.15.

14. The semiconductor transistor of claim 13 wherein the ratio is at least 0.2.

15. The semiconductor transistor of claim 14 wherein the ratio is at east 0.35.

16. The semiconductor transistor of claim 15 wherein the ratio is approximately $$\frac{92}{215}.$$

17. The semiconductor transistor of claim 3 wherein the film material includes the semiconductor material and an additive, wherein:

(a) if the dopant is a p-dopant, the second spacing is larger than the first spacing due to the additive; and (b) if the dopant is an n-dopant, the second spacing is smaller than the first spacing due to the additive.

18. The semiconductor transistor of claim 17 wherein:

(a) if the dopant is a p-dopant, the additive is germanium; and (b) if the dopant is an n-dopant, the additive is carbon.

19. The semiconductor transistor of claim 12 wherein the depth is at least 80 nm.

20. The semiconductor transistor of claim 12 wherein the width is less than 220 nm.

* * * * *